United States Patent
Le Bellac et al.

(10) Patent No.: US 6,383,642 B1
(45) Date of Patent: May 7, 2002

(54) TRANSPARENT SUBSTRATE PROVIDED WITH HYDROPHOBIC/OLEOPHOBIC COATING FORMED BY PLASMA CVD

(75) Inventors: David Le Bellac, Courbevoie; Claude Bernard, Annet sur Marne, both of (FR)

(73) Assignee: Saint-Gobain Vitrage, Courbevoie (FR)

( * ) Notice: Subject to any disclaimer, the term of this patent is extended or adjusted under 35 U.S.C. 154(b) by 0 days.

(21) Appl. No.: 09/546,641

(22) Filed: Apr. 10, 2000

(51) Int. Cl.⁷ .............................................. B32B 27/36
(52) U.S. Cl. ....................... 428/412; 428/429; 428/446; 428/447; 427/162; 427/163.1; 427/164; 427/167

(58) Field of Search .................................. 428/412, 429, 428/446, 447; 427/162.1, 163.1, 164, 167

(56) References Cited

U.S. PATENT DOCUMENTS 6,299,981 B1 * 10/2001 Azzopoudi et al. ......... 428/429

* cited by examiner

*Primary Examiner*—Leszek Kiliman
(74) *Attorney, Agent, or Firm*—Oblon, Spivak, McClelland, Maier & Neustadt, P.C.

(57) ABSTRACT

A hydrophobic/oleophobic coating is formed on a substrate by a process, which comprises ionizing at least one precursor during deposition on the substrate, while during deposition the substrate temperature decreases from a temperature above 80° C. to a temperature below 80° C.

17 Claims, No Drawings

TRANSPARENT SUBSTRATE PROVIDED WITH HYDROPHOBIC/OLEOPHOBIC COATING FORMED BY PLASMA CVD

BACKGROUND OF THE INVENTION

1. Field of the Invention

The present invention relates to the field of substrate materials, especially transparent substrates, which have hydrophobic/oleophobic properties with the objective of achieving certain rain-proof/dirt-proof effects. For this purpose, such a substrate is provided, for example, with a coating considering the particular application, out of many applications, in which the substrate is to be used, such as glazing materials for aeronautical, sea-going or overland (railroad, highway) transportation vehicles, for buildings (windows), for urban fixtures (billboards, Abribus, etc.) or for interior appointments (decorative panels, furniture), electrical appliances (refrigerator doors, oven doors, windows, etc., glass ceramic plates), cooking utensils, sanitary fixtures (wash basins, bathtubs, etc.), construction materials, etc.

2. Discussion of the Background

Substrates which have been used in the past for various applications may or may not be transparent and generally have been glass, ceramic, glass ceramic, metal, plastic material (polymethyl methacrylate (PMMA), polyvinylbutyral (PVB), polycarbonate (PC) or polyurethane (PU), thermoplastic ethylene/vinyl acetate copolymer (EVA), polyethylene terephthalate (PET), polybutylene terephthalate (PBT), polycarbonate/polyester copolymers, cycloolefin copolymers of the ethylene/norbornene and ethylene/cyclopentadiene type, ionomeric resins such as an ethylene/methacrylic acid copolymer neutralized by a polyamine, thermosetting or thermally crosslinkable compounds such as polyurethane, unsaturated polyester (UPE), ethylene/vinyl acetate copolymer, and the like., or a combination of a plurality of such materials.

The hydrophobic/oleophobic property referred to relates to the fact that polar and nonpolar liquids do not adhere to a substrate to form a troublesome film. A substrate with this property will have little or no tendency to retain dust or dirt or any kind, fingerprints, insects, and the like.

The presence of water and/or dirt on the substrate results in an unesthetic appearance and, in certain cases, to a reduction of transparency of the substrate, as well as to a change of visibility through the substrate. Such effects are particularly troublesome when the substrate is a glazing material used in the transportation field.

The hydrophobic/oleophobic, or non-wettability, property of a substrate is based on the fact that the contact angles between a liquid and a given substrate are high, at least 90° C. in the case of water, for example. The liquid then tends to flow easily over the substrate in the form of drops, by simple gravity, if the substrate is inclined or under the effect of aerodynamic forces in the case of a moving vehicle. Known agents for imparting this hydrophobic/oleophobic property are, for example, fluoroalkylsilanes such as described in European Patent Application Nos. EP 0 492 417, EP 0 492 545 and EP 0 672 779.

Common hydrophobic/oleophobic agents include, in particular, the alkyltrihalosilanes and trialkoxysilanes in which the alkyl group has at least one perfluoro terminal group, or in other words a group comprising $F_3C-(CF_2)_n-$, in which n is a positive integer or zero, as described in European Patent Application No. EP 0 719 743.

The hydrophobic/oleophobic agents are applied in known manner in solution by standard deposition methods, with or without heating.

One of the most pressing problems in this area of technology is that of the durability of the hydrophobic/oleophobic coating. Such coatings, in fact, have been affected by erosion, which never fails to occur to some extent, for example, during the indispensable operations of periodic cleaning of the substrate, when it is transparent, in order to restore satisfactory visibility through the substrate. There is, therefore, constant motivation to slow the progressive removal of hydrophobic/oleophobic coatings of the cited type, which occurs, in particular, because of the action of windshield wipers, all the more so because such removal can also result by degradation of the coating by ultraviolet radiation.

Heretofore, two main methods have been examined with a view to increasing the durability of coatings while limiting the effects of erosion. These two methods both involve increasing the adhesion of coatings to substrates.

In the first approach as described in European Patent Application No. EP 0 484 746, a substrate is preliminarily treated with a primer of the tetrahalosilane or tetraalkoxysilane type.

In the second approach as described in European Patent Application No. EP 0 497 189, irregularities of dimensions between 1 and 10 microns, for example, are created on the substrate surface either by deposition of particles or by various etching processes such as chemical treatment or sandblasting.

Another commonly observed phenomenon is the progressive disappearance of the hydrophobic/oleophobic property under the effect of prolonged exposure to ultraviolet radiation, which more or less destroys the hydrophobic/oleophobic coatings.

It is further pointed out that, in all cases, reestablishment of a new hydrophobic/oleophobic coating to remedy the erosion of the previous coating does not pose any particular difficulty. Treatments of old coatings can be done, after such a coating has been briefly cleaned. Nevertheless, the merit of postponing this operation as long as possible remains obvious. A need, therefore, continues to exist for hydrophobic/oleophobic coatings of increased durability.

SUMMARY OF THE INVENTION

Accordingly, one object of the present invention is to provide a different technique which is capable of achieving hydrophobic/oleophobic coatings of improved durability, especially under exacting conditions of solid friction and exposure to ultraviolet radiation.

Briefly, this object and other objects of the present invention as hereinafter will become more readily apparent can be attained in a process for the formation of a hydrophobic/oleophobic coating on a substrate, which comprises:

ionizing at least one precursor during deposition on a substrate, while during deposition the substrate temperature decreases from a temperature above 80° C. to a temperature below 80° C.

DETAILED DESCRIPTION OF THE PREFERRED EMBODIMENTS

The technique of the present invention makes it possible to form coatings in thin and homogeneous layers with great adhesion to a substrate, while permitting the refractive index of the coated substrate to be adjusted as desired by judicious choice of the precursor or precursors employed in any given coating process, in particular to a value almost identical to that of the glass.

Accordingly, an advantageous embodiment of the present process is that the prepared product is transparent and has the optical qualities of a glazing material. The substrate comprises glass or a plastic material such as polymethyl methacrylate (PMMA) or polycarbonate (PC), coated if necessary with a primer, especially based on silica, to favor adhesion of the overlying coating. The said precursor is a silicon compound. An organometallic precursor, alone or in combination with one or more other precursors, especially silicon-containing compounds as mentioned above, is also a suitable. A particularly suitable and appropriate compound, for example, has proved to be one containing tin oxide groups distributed in a carbon chain.

The following compounds are eminently satisfactory as silicon-containing precursors:
- a silane such as tetramethylsilane or hexamethyldisilane;
- an alkoxysilane such as an alkoxytrialkylsilane in which the alkyl group is a methyl, ethyl, propyl or isopropyl group, methyl being preferred;
- fluorosilane, especially a perfluoroalkylalkyltrialkoxysilane or a perfluoroalkylalkyltrihalosilane;
- a siloxane such as hexamethyldisiloxane;
- a silazane such as hexamethyldisilazane;
- and derivatives thereof.

The precursor is preferably introduced into a chamber in which pulses having a frequency from 10 kHz to 10 GHz and a power from 100 to 2000 W are created for a substrate surface area of 0.4 $M^2$ which is to be coated. Of course, the power is proportional to the surface area which is to be coated. The substrate is conveniently placed on a thermostatted support whose temperature can be varied in order that the temperature of the substrate be varied within the range of above 80° C. to below 80° C.

In a particularly advantageous embodiment, the precursor is hexamethyldisiloxane, which is introduced into the chamber at a flowrate ranging from 50 to 500 $cm^3$/min, in such a manner is to establish and maintain a pressure of 0.1 to 70 Pa therein.

Furthermore, there are three main embodiments of the present process.

In the first process embodiment, the vaporized precursor is introduced into the chamber, which is connected to ground via a cathode which is porous or perforated with holes and connected to a pulse generator.

In the second process embodiment, the vaporized precursor is introduced into the chamber, which is connected to ground via perforated pipe burners, and waves are emitted into the chamber by a waveguide connected to a pulse generator. The waveguide is made of metal, for example, has a rectangular cross-section, and is disposed above the chamber while having exactly the same shape as the chamber. The waves are transmitted through a quartz window provided in the chamber wall.

In the third main process embodiment, the vaporized precursor is introduced into the chamber, which is connected to ground, and the substrate is coated with a conductive layer connected to an alternating current generator. A perfectly suitable conductive layer is one based on substoichiometric and/or doped metal oxide such as indium oxide, doped with tin (ITO), zinc oxide doped with indium (ZnO:In), with fluorine (ZnO:F), with aluminum (ZnO:Al) or with tin (ZnO:Sn), tin oxide doped with fluorine ($SnO_2$:F) or with tetravalent or pentavalent antimony ($SnO_2$:Sb).

The substrate is, therefore, used here as an electrode in the creation of the discharge for ionization. This embodiment is particularly suitable for deposition on a large-sized substrate. The homogeneity of the resulting coating is better; the activated chemical species do not have time to diffuse inhomogeneously between the cathode and substrate, but are created directly at the substrate surface. It is specified that, compared with the first embodiment which uses a cathode that is porous or perforated with holes, the deposits in this case are achieved with low power, so that the conductive layer is not destroyed during the electrical discharge. The optimum power for the surface area of 20 cm×20 cm of the deposit then ranges from 100 W to 25 W. Simultaneously, the rate of deposition is considerably increased, for example, from 0.5–0.6 Å/s to 17–38 Å/s.

Another aspect of the invention is a substrate provided with an external hydrophobic/oleophobic coating, or in other words a coating designed for direct exposure to the ambient atmosphere, which coating is formed by using a process such as described hereinabove. The thickness of this hydrophobic/oleophobic coating ranges from 10 to 100 nm, preferably from 20 to 80 nm.

In addition, it is desirable to avoid local accumulations of electrostatic charges that develop in applications such as aircraft windshields; that is, to actually provide for the discharge of such charges by conduction. Such accumulations constitute, in fact, a source of crazing and destruction of any laminated layers that may be present, and especially of the hydrophobic/oleophobic coating. Two separate methods are hereby proposed to overcome this problem:
- either the hydrophobic/oleophobic coating itself is antistatic, or
- its thickness does not exceed 50 $\mu$m, the substrate on which it is formed being antistatic.

Suitable antistatic materials include those cited hereinabove for the conductive layer employed in the third alternative of the process of the invention, and/or materials formed by processes similar to those employed for formation of the hydrophobic/oleophobic coating. Furthermore, the hydrophobic/oleophobic coating can be made antistatic, for example, by adding a certain amount of $SiH_4$ to the hexamethyldisiloxane used as precursor, so as to create Si—Si bonds in the resulting coating. In this regard $CH_4$ achieves a function which is analogous to that of $SiH_4$, as can metal salts of the copper acetylacetonate type.

In a particularly advantageous embodiment of the invention, a substrate containing an anti-dazzle coating covered by the said hydrophobic/oleophobic coating or having such a coating as the external portion thereof is provided. An anti-dazzle coating usually comprises a succession of interferential thin layers, generally in the form of alternating layers based on dielectric materials with high and low refractive indices. When deposited on a transparent substrate, such a coating acts to reduce the light reflection thereof and, therefore, to increase light transmission therethrough.

On the outer surface of an automobile windshield, for which high levels of light transmission, generally better than 75%, and a very low residual bloom (less than 1% of the transmitted light) are required, the anti-dazzle effect results in improved visual comfort of the driver and passengers.

The inventors achieve consecutive formation of an anti-dazzle coating and of a hydrophobic/oleophobic coating by using a single installation and similar or even identical processes, while obtaining excellent adhesion between the two coatings, or even the formation of a coating which is both anti-dazzle and hydrophobic/oleophobic. In fact, such coatings can be obtained in particular by applying a radio frequency or microwave plasma CVD technique to precursor compositions that vary as a function of time. The precursor compositions are varied discontinuously (separate layers) or continuously (single layer with composition gradient). The different precursors used are selected with a view to obtaining materials of different refractive indices. Such materials are based, for example, on $SiO_xN_y$, where x and y, respectively, have values of 0 to 2 and 0 to 1.33.

Another aspect of the invention is a monolithic laminated or multi-layer glazing material for buildings or for transportation vehicles, wherein at least one surface is designed to be in contact with the ambient atmosphere and is provided with a hydrophobic/oleophobic coating formed on a substrate by using a process such as described hereinabove.

Having now generally described this invention, a further understanding can be obtained by reference to certain specific examples which are provided herein for purposes of illustration only and are not intended to be limiting unless otherwise specified.

EXAMPLE

A hydrophobic/oleophobic coating is deposited on each of three specimens of sodium calcium silicate float glass measuring 20 cm×20 cm by the following procedure.

The specimens are placed consecutively on a thermostatted support whose temperature can be varied, in a chamber connected to ground.

Vaporized hexamethyldisiloxane (HMDSO) is passed into the chamber via a cathode perforated with holes of 2 mm diameter. This cathode was preferred to a porous cathode, because in the present case the perforated seems to favor better plasma stability. The flowrate of HMDSO is 300 $cm^3$/min, which makes it possible to establish and maintain an HMDSO pressure of 6.67 Pa in the chamber.

The plasma is created by transmission of waves into the chamber at a frequency of 100 kHz and a power of 100 W.

The rate of deposition of the hydrophobic/oleophobic coating obtained in this way is 0.5 Å/s. The duration of deposition for the three specimens is 800 s, corresponding to a coating thickness of 40 nm.

The first two specimens are maintained at constant temperature throughout the entire duration of deposition, specifically at 200° C. and room temperature respectively. The third specimen is at 200° C. during the first half of the treatment and then at room temperature during the second half.

In a first experiment, the resistance of the three specimens to erosion is evaluated by measuring the persistence of the hydrophobic/oleophobic property during a Taber test performed with a load of 500 g and CS 10 F grinding wheels. To do so, the contact angle of water at equilibrium is measured, on the one hand, in the absence of abrasion and on the other hand after 100 revolutions of the grinding wheel.

In a second experiment the resistance to ultraviolet radiation is evaluated by measuring the contact angle of water at equilibrium after a 1000-hour test with the Weather-Ometer (WOM), which combines ultraviolet exposure and a temperature of 90° C.

The results are presented in the following table:

|  | Layer deposited at 200° C. | Layer deposited at room temperature | Double layer at 200° C./room temperature |
| --- | --- | --- | --- |
| Initial water | 100° ± 5° | 100° ± 5° | 100° ± 5° |
| Water after 100 revolutions in Taber test | 90° | <50° | 80° |
| Water after 1000 h in WOM test | 70° | 84° | 84° |

It is apparent that the layer deposited at 200° C. is resistant to abrasion but has much poorer resistance to LV radiation. The opposite behavior is found for the layer deposited at room temperature. Only the third coating, according to the invention, has satisfactory resistance to both stresses.

This observation is also valid under real conditions of use, where the two causes of wear coexist, particularly in the form of the combination of windshield wiper action and sunlight. In fact, it is found that the layer deposited at room temperature on the layer deposited at 200° C. has increased durability relative to abrasion than does the layer deposited at room temperature directly on the glass. It is believed that the adhesion and cohesion in the thickness of such a layer are better in the first case.

Another noteworthy advantage of the coating formed according to the present process is its resistance to the thermal cambering cycle (8 minutes at 620° C. then cooling to room temperature), during which the contact angle of water at equilibrium changes from 100° C. to 96° C.

Thus the invention provides an excellent hydrophobic/oleophobic coating for a transparent substrate such as glass; the refractive index n of the HMDSO coating of the example is approximately 1.47, which is very close to that of glass.

The durability of the coating is also excellent, even under harsh conditions of abrasion and exposure to ultraviolet radiation.

The disclosure of French priority Application No. 99/04431 filed Apr. 9, 1999 is hereby incorporated by reference into the present application.

Obviously, numerous modifications and variations of the present invention are possible in light of the above teachings. It is, therefore, to be understood that within the scope of the appended claims, the invention may be practiced otherwise than as specifically described herein.

What is claimed as new and is intended to be secure by Letters Patent is:

1. A process for depositing a hydrophobic/oleophobic coating on a substrate, which comprises:
    ionizing at least one hydrophobic/oleophobic coating precursor in the vapor phase and concomitantly depositing the ionized material onto a substrate at a temperature of above 80° C. to form a coating thereon; and
    while ionizing and depositing the hydrophobic/oleophobic coating precursor on the substrate, decreasing the temperature of the substrate below 80° C. to complete formation of the hydrophobic/oleophobic coating.

2. The process according to claim 1, wherein the substrate is glass or a plastic material and the hydrophobic/oleophobic precursor is a silicon compound, the product prepared being transparent and having the optical qualities of a glazing material.

3. The process according to claim 2, wherein the plastic material is polymethyl methacrylate (PMMA) or polycarbonate (PC) and wherein the substrate is coated with silica which promotes adhesion of the silicon precursor material deposited to the substrate.

4. The process according to claim 2, wherein said silicon compound is selected from the group consisting of a silane, an alkoxysilane, a fluorosilane, a siloxane, a silazane and derivatives thereof.

5. The process according to claim 4, wherein said silane is tetramethylsilane or hexamethyldisilane; said alkoxysilane is an alkoxytrialkylsilane in which the alkyl group is a methyl, ethyl, propyl or isopropyl group; the fluorosilane is a perfluoroalkylalkyltrialkoxysilane or a perfluoroalkylalkyltrihalosilane; the siloxane is hexamethyldisiloxane and the silazane is hexamethyldisilazane.

6. The process according to claims 1, wherein the hydrophobic/oleophobic coating precursor is introduced into a chamber in which pulses having a frequency ranging from 10 kHz to 10 GHz and a power ranging from 100 to 2000 W are created by a generator for a substrate having a surface area of 0.4 $m^2$ to be coated.

7. The process according to claim 6, wherein the hydrophobic/oleophobic coating precursor is hexamethyldisiloxane which is introduced into the chamber at a flow rate ranging from 50 to 500 $cm^3$/min while a pressure of 0.1 to 70 Pa therein is established and maintained therein.

8. The process according to claim 1, wherein the vaporized hydrophobic/oleophobic coating precursor is introduced into a chamber, which is connected to ground via a cathode which is porous or perforated with holes and connected to a pulse generator.

9. The process according to claim 1, wherein the vaporized hydrophobic/oleophobic coating precursor is introduced into the chamber, which is connected to ground via perforated pipe burners, and waves are emitted into the chamber by a waveguide connected to a pulse generator.

10. The process according to claim 1, wherein the vaporized hydrophobic/oleophobic coating precursor is introduced into a chamber, which is connected to ground, and wherein the substrate is coated with a conductive layer connected to an alternating current generator.

11. The process according to claim 10, wherein the conductive layer is based on a substoichiometric and/or doped metal oxide selected from the group consisting of indium oxide doped with tin (ITO), zinc oxide doped with indium (ZnO:In), with fluorine (ZnO:F), with aluminum (ZnO:Al) or with tin (ZnO:Sn) and tin oxide doped with fluorine ($SnO_2$:F) or with tetravalent or pentavalent antimony ($SnO_2$:Sb).

12. A substrate provided with an external hydrophobic/oleophobic coating formed by the process according to claim 1, the thickness of the coating ranging from 10 to 100 nm.

13. The substrate according to claim 12, which has a thickness ranging from 20 to 80 nm.

14. The substrate according to claim 13, wherein the hydrophobic/oleophobic coating is antistatic.

15. The substrate according to claim 13, wherein the hydrophobic/oleophobic coating has a thickness at most equal to 50 nm, and the substrate is antistatic.

16. The substrate according to claim 12, provided with an anti-dazzle coating, the said hydrophobic/oleophobic coating of which may comprise the external portion.

17. A monolithic laminated or multi-layer glazing material for buildings or for transportation vehicles, wherein at least one surface designed to be in contact with the ambient atmosphere comprises a hydrophobic/oleophobic coating formed on a substrate by the process of claim 1.

* * * * *

UNITED STATES PATENT AND TRADEMARK OFFICE
CERTIFICATE OF CORRECTION

PATENT NO. : 6,383,642 B1
DATED : May 7, 2002
INVENTOR(S) : Le Bellac et al.

It is certified that error appears in the above-identified patent and that said Letters Patent is hereby corrected as shown below:

<u>Title page,</u>
Item [30], Foreign Application Data, should read
-- [30]  Foreign Application Priority Data
      Apr. 9, 1999      (FR)............................................ 99 04431 --

Signed and Sealed this

Fifteenth Day of October, 2002

Attest:

Attesting Officer

JAMES E. ROGAN
*Director of the United States Patent and Trademark Office*